(12) United States Patent
Siniscalchi et al.

(10) Patent No.: US 8,143,944 B2
(45) Date of Patent: Mar. 27, 2012

(54) METHOD AND APPARATUS FOR SENSING A CURRENT FOR VARYING IMPEDANCE LOADS

(75) Inventors: Patrick P. Siniscalchi, Murphy, TX (US); Mayank Garg, Richardson, TX (US); Roy Clifton Jones, III, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 12/861,621

(22) Filed: Aug. 23, 2010

(65) Prior Publication Data

US 2012/0044020 A1 Feb. 23, 2012

(51) Int. Cl.
*H03F 3/217* (2006.01)
(52) U.S. Cl. .................................. 330/251; 330/207 A
(58) Field of Classification Search .................. 330/10, 330/207 A, 251
See application file for complete search history.

(56) References Cited

U.S. PATENT DOCUMENTS

| | | | |
|---|---|---|---|
| 6,600,618 B2 | 7/2003 | Schlager | |
| 6,614,297 B2 | 9/2003 | Score et al. | |
| 6,865,417 B2 | 3/2005 | Rissmann et al. | |
| 7,194,303 B2 | 3/2007 | Rissmann et al. | |
| 7,332,962 B2 | 2/2008 | Wu et al. | |
| 7,355,473 B2 | 4/2008 | Wu | |
| 7,388,426 B2 | 6/2008 | Chang et al. | |
| 7,471,144 B2 | 12/2008 | Lipcsei | |
| 7,545,207 B2 | 6/2009 | Chang et al. | |
| 7,737,776 B1 | 6/2010 | Cyrusian | |
| 7,800,437 B2 * | 9/2010 | Khoury et al. | 330/251 |
| 7,994,857 B2 * | 8/2011 | Albers et al. | 330/251 |
| 2002/0141098 A1 | 10/2002 | Schlager | |

OTHER PUBLICATIONS

"Current-Sensing Techniques for DC-DC Converters," Proc. IEEE Midwest Symposium on Circuits and Systems, 2002, MWSCAS., vol. 2, pp. 577-580 (Hassan Pooya Forghani-zadeh and Gabriel A. Rincon-Mora).

* cited by examiner

*Primary Examiner* — Khanh Nguyen
(74) *Attorney, Agent, or Firm* — John J. Patti; Wade J. Brady, III; Frederick J. Telecky, Jr.

(57) ABSTRACT

Recently, there has been an increased desire to measure load currents of class-D amplifiers to improve performance. The traditional solution has been to include one or more discrete components in series with the load, but this degrades performance. Here, however, circuit is provided (which includes sample-and-hold circuit) that accurately measures load currents without inhibiting performance and that is not inhibited by the phase differences between the load voltage and load current.

20 Claims, 6 Drawing Sheets

METHOD AND APPARATUS FOR SENSING A CURRENT FOR VARYING IMPEDANCE LOADS

TECHNICAL FIELD

The invention relates generally to sensing load currents in switching systems and, more particularly, to determining the load current for a class-D amplifier.

BACKGROUND

The quest for ever-increasing audio performance has brought about an increased desire to determine the characteristics of a load of an amplifier (i.e., speaker). Detecting the impedance (and any degradation thereof), for example, would enable one to protect the speaker load from being overdriven. The typical approach would be to place components (i.e., a sense resistor) in series with the load. However, the addition of these components degrades the efficiency of the amplifier and creates issues with common mode signals. Thus, it is desirable to perform measurements without the use of external components that would interfere with the normal operation of the amplifier.

Figure 1:
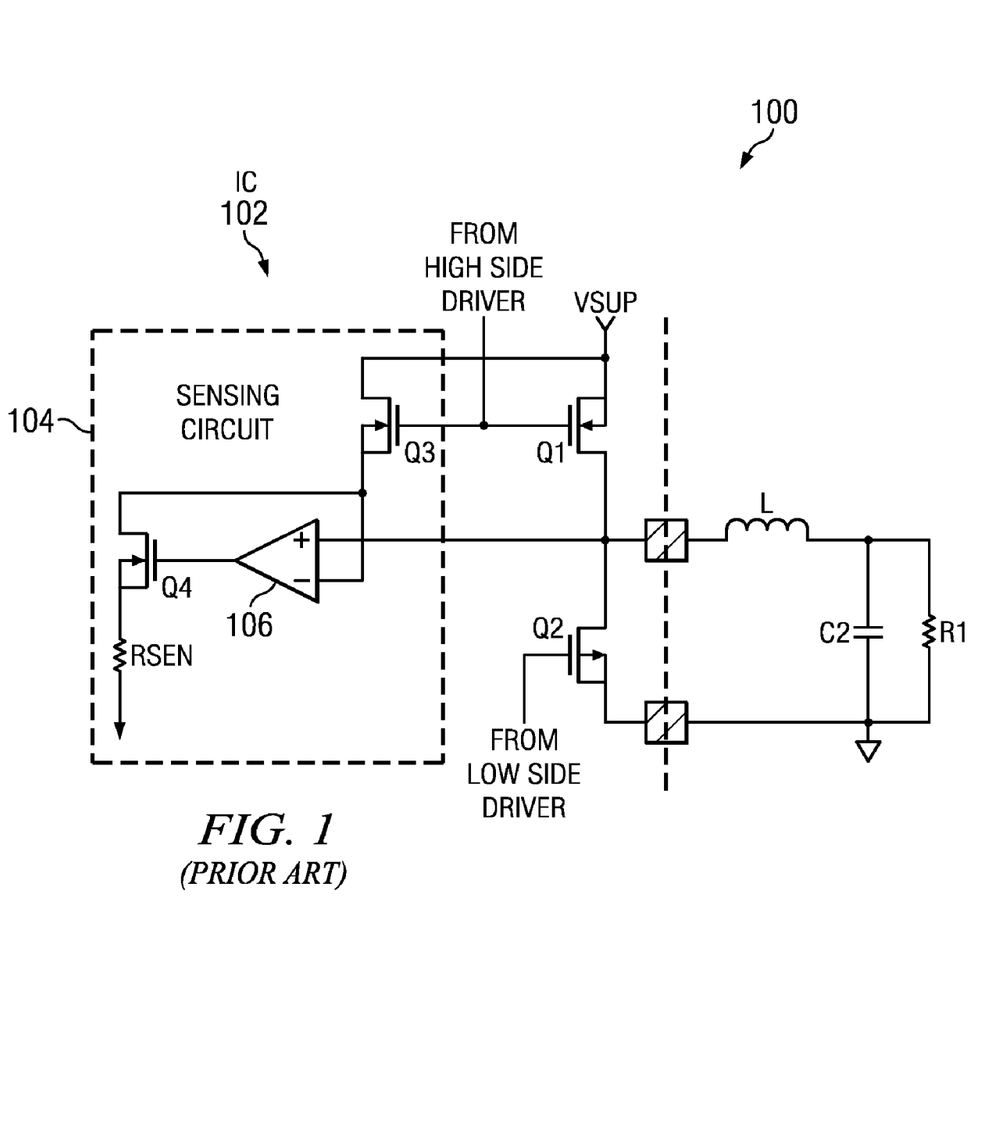
FIG. 1 is an example of a current sensing scheme for a DC-DC converter.

Today, class-D amplifiers are desirable because of their high efficiency. Class-D amplifiers employ a pulse width modulator (PWM) that controls the transistors of an H-bridge, which includes high-side and low-side transistors. Because of the structure of the H-bridge and the driving of an inductive load (i.e., speaker), class-D amplifiers and DC-DC converters share some common characteristics. In FIG. 1, an example of a current sensing scheme for a DC-DC converter 100 can be seen. As shown, the switches or transistors Q1 and Q2 (which operate as the high-side and low-side transistors) and the sensing circuit 104 (which generally comprises transistors Q3 and Q4, resistor RSEN, and amplifier 106) are internal to integrated circuit 102, while the inductive load (which generally comprises inductor L, resistor R1, and capacitor C2) are external to IC 102. Here, the load current is replicated across resistor RSEN to generate a sense voltage (which is the voltage drop across resistor RSEN).

The arrangement of circuit 100, however, is inadequate for class-D amplifiers. With DC-DC converters (such as converter 100), voltage swings are relatively small, so one would be able to continuously perform current sense measurements. With class-D amplifiers, on the other hand, the swings are rail-to-rail, which would not allow for continuous current sensing. Therefore, there is a need for a current sensing circuit for class-D amplifiers that would not generally interfere with normal operation of the amplifier.

Some examples of conventional circuits are: U.S. Pat. No. 7,545,207; U.S. Pat. No. 6,600,618; U.S. Pat. No. 6,614,297; U.S. Pat. No. 6,865,417; U.S. Pat. No. 7,194,303; U.S. Pat. No. 7,332,962; U.S. Pat. No. 7,355,473; U.S. Pat. No. 7,388,426; U.S. Pat. No. 7,471,144; U.S. Pat. No. 7,737,776; U.S. Patent Pre-Grant Publ. No. 2002/0141098; and Forghanizadeh et al., "Current-Sensing Techniques for DC-DC Converters," *Proc. IEEE Midwest Symposium on Circuits and Systems*, 2002, MWSCAS, vol. 2, pp. 577-580.

SUMMARY

A preferred embodiment of the present invention, accordingly, provides an apparatus. The apparatus comprises a class-D amplifier having a low-side recycling mode, a pair of low-side NMOS transistors, and a pair of output terminals; a sample-and-hold (S/H) that is coupled to the pair of output terminals, wherein the S/H circuit samples a voltage on each of the pair of output terminals of the class-D amplifier when its associated low-side NMOS transistor is actuated; a current generator that is coupled to the S/H circuit, wherein the current generator uses the voltages on the pair of output terminals sampled by the S/H circuit to minor the drain-source voltages of the pair of low-side NMOS transistors on a pair of sense transistors, and wherein the drain-source voltages mirrored on the pair of sense transistors generates a pair of sense currents; and a current-to-voltage (I-to-V) converter that is coupled to the current generator so as to convert the sense currents to a sense voltage.

In accordance with a preferred embodiment of the present invention, the S/H circuit further comprises: a pair of switches, wherein each switch is coupled to at least one of the pair of output terminals, and wherein each switch is associated with at least one of the pair of low-side NMOS transistors; a pair of resistors, and a pair of capacitors, wherein each capacitor is associated with at least one of the switches, and wherein each switch provides the voltage from its associated output terminal when its associated low-side NMOS transistor is actuated.

In accordance with a preferred embodiment of the present invention, the ratio of sizes of each of the pair of sense transistors to its associated low-side NMOS transistor is 1:N, wherein N is greater than or equal to 1.

In accordance with a preferred embodiment of the present invention, an apparatus is provided. The apparatus comprises an H-bridge having a first input terminal, a second input terminal, a first output terminal, and a second output terminal; a first driver that is coupled to provide a first control signal to the first terminal of the H-bridge; a second driver that is coupled to provide a second control signal to the second terminal of the H-bridge; an S/H circuit that is coupled to the first driver, second driver, the first output terminal of the H-bridge, and the second output terminal of the H-bridge, wherein the S/H circuit samples a first output voltage from the first output terminal of the H-bridge based at least in part on the state of the first control signal, and wherein the S/H circuit samples a second voltage from the second output terminal of the H-bridge based at least in part on the state of the second control signal; a current generator including: a first amplifier having a first input terminal, a second terminal, and an output terminal, wherein the first input terminal of the first amplifier is coupled to the S/H circuit; a second amplifier having a first input terminal, a second terminal, and an output terminal, wherein the first input terminal of the second amplifier is coupled to the S/H circuit; a first transistor having a first passive electrode, a second passive electrode, and a control electrode, wherein the control electrode of the first transistor is coupled to the output terminal of the first amplifier; a second transistor having a first passive electrode, a second passive electrode, and a control electrode, wherein first passive electrode of the second transistor is coupled to the second passive electrode of the first transistor; a third transistor having a first passive electrode, a second passive electrode, and a control electrode, wherein the control electrode of the third transistor is coupled to the output terminal of the second amplifier; and a fourth transistor having a first passive electrode, a second passive electrode, and a control electrode, wherein first passive electrode of the fourth transistor is coupled to the second passive electrode of the third transistor; and an I-to-V converter that is coupled to the first passive electrodes of the first and third transistors.

In accordance with a preferred embodiment of the present invention, the H-bridge further comprises: a first low-side transistor having a first passive electrode, a second passive electrode, and a control electrode, wherein the first passive electrode of the first low-side transistor is coupled to the first output terminal of the H-bridge, and wherein the control electrode of the first low-side transistor is coupled to the first driver; and a second low-side transistor having a first passive electrode, a second passive electrode, and a control electrode, wherein the first passive electrode of the second low-side transistor is coupled to the second output terminal of the H-bridge, and wherein the control electrode of the second low-side transistor is coupled to the second driver.

In accordance with a preferred embodiment of the present invention, ratio of the sizes the second transistor to the first low-side transistor and the fourth transistor to the second low-side transistor is 1:N, wherein N is greater than or equal to 1.

In accordance with a preferred embodiment of the present invention, the S/H circuit further comprises: a first switch that is coupled to the first output terminal of the H-bridge, wherein the first switch is controlled by the first control signal; a second switch that is coupled to the second output terminal of the H-bridge, wherein the second switch is controlled by the second control signal; a first resistor that is coupled to the first switch; a second resistor that is coupled to the second switch; a first capacitor that is coupled to the first resistor; and a second capacitor that is coupled to the second resistor.

In accordance with a preferred embodiment of the present invention, the first and second switch are each double-throw switches that are each coupled to ground, and wherein the current generator further comprises: a third switch that is coupled to the first resistor and that is controlled by the second control signal; a first set of resistors coupled in series with one another between the third switch and the second passive electrode of the first transistor, wherein the second input terminal of the first amplifier is coupled to a node between at least two resistors from the first set; a fourth switch that is coupled to the first resistor and that is controlled by the first control signal; and a second set of resistors coupled in series with one another between the fourth switch and the second passive electrode of the third transistor, wherein the second input terminal of the second amplifier is coupled to a node between at least two resistors from the second set.

In accordance with a preferred embodiment of the present invention, the I-to-V converter further comprises a differential amplifier that outputs a differential sense voltage.

In accordance with a preferred embodiment of the present invention, the I-to-V converter further comprises: a current minor that is coupled to the first passive electrode of the first transistor; and a third amplifier having an input terminal that is coupled to the current mirror and the first passive electrode of the third transistor.

In accordance with a preferred embodiment of the present invention, an apparatus is provided. The apparatus comprises a class-D amplifier having: a negative output terminal; a positive output terminal; a first NMOS transistor that is coupled to the negative output terminal at its drain and that is controlled by a first control signal; a second NMOS transistor that is coupled to the positive output terminal at its drain and that is controlled by a second control signal; an S/H circuit that is coupled to the negative output terminal and the positive output terminal, wherein the S/H circuit samples the voltage on the negative output terminal when the first NMOS transistor is actuated, and wherein the S/H circuit samples the voltage on the positive output terminal when the second NMOS transistor is actuated; a current generator having: a first amplifier having a first input terminal, a second terminal, and an output terminal, wherein the first input terminal of the first amplifier is coupled to the S/H circuit; a second amplifier having a first input terminal, a second terminal, and an output terminal, wherein the first input terminal of the second amplifier is coupled to the S/H circuit; a third NMOS transistor that is coupled to the output terminal of the first amplifier at its gate; a fourth NMOS transistor that is coupled to the source of the third NMOS at its drain; a fifth NMOS transistor that is coupled to the output terminal of the second amplifier at its gate; a sixth NMOS transistor that is coupled to the source of the fifth NMOS at its drain; and an I-to-V converter that is coupled to the drains of the third and fifth NMOS transistors.

In accordance with a preferred embodiment of the present invention, ratio of the sizes the fourth NMOS transistor to the first NMOS transistor and the sixth NMOS transistor to the second NMOS transistor is 1:N, wherein N is greater than or equal to 1.

In accordance with a preferred embodiment of the present invention, the S/H circuit further comprises: a first switch that is coupled to the negative output terminal, wherein the first switch is controlled by the first control signal; a second switch that is coupled to the positive output terminal, wherein the second switch is controlled by the second control signal; a first resistor that is coupled to the first switch; a second resistor that is coupled to the second switch; a first capacitor that is coupled to the first resistor; and a second capacitor that is coupled to the second resistor.

In accordance with a preferred embodiment of the present invention, the first and second switch are each double-throw switches that are each coupled to ground, and wherein the current generator further comprises: a third switch that is coupled to the first resistor and that is controlled by the second control signal; a first set of resistors coupled in series with one another between the third switch and the second passive electrode of the first transistor, wherein the second input terminal of the first amplifier is coupled to a node between at least two resistors from the first set; a fourth switch that is coupled to the first resistor and that is controlled by the first control signal; and a second set of resistors coupled in series with one another between the fourth switch and the second passive electrode of the third transistor, wherein the second input terminal of the second amplifier is coupled to a node between at least two resistors from the second set.

In accordance with a preferred embodiment of the present invention, a method is provided. The method comprises actuating at least one of a first and a second low-side NMOS transistors within a class-D amplifier; sampling voltages on each of positive and negative output terminals of the class-D amplifier when its associated low-side NMOS transistors is actuated; generating first and second sense currents from the first and second low-side NMOS transistors of the class-D amplifier, respectively; and converting the first and second sense currents into a sense voltage.

In accordance with a preferred embodiment of the present invention, the step of generating the first and second sense currents further comprises minoring the drain-source voltages of the first and second low-side NMOS transistor on first and second sense NMOS transistors, respectively.

In accordance with a preferred embodiment of the present invention, the ratio of the first sense current to a first current through the first NMOS transistor is 1:N, wherein N is greater than or equal to 1.

In accordance with a preferred embodiment of the present invention, the ratio of the second sense current to a second current through the second NMOS transistor is 1:N, wherein N is greater than or equal to 1.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
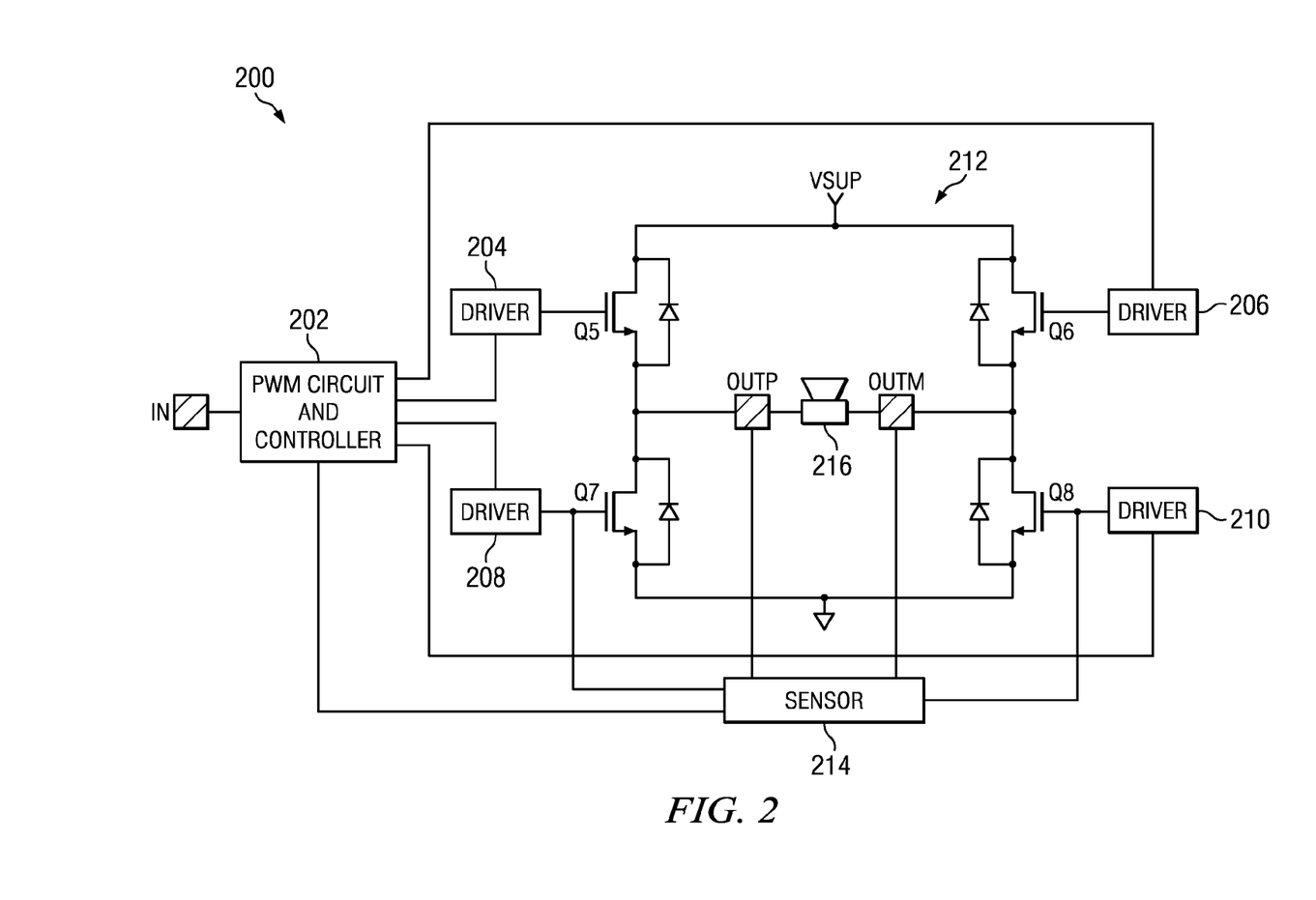
FIG. 2 is a circuit diagram of an example of a class-D amplifier with a current sensor in accordance with a preferred embodiment of the present invention.

Turning to FIG. 2 of the drawings, a circuit 200 that includes a class-D amplifier with a current sensor in accordance with a preferred embodiment of the present invention can be seen. The class-D amplifier is generally comprised of PWM circuit and controller 202, H-bridge 212 (which generally comprises NMOS transistors Q5 through Q8), and drivers 204, 206, 208, and 210. In operation, the PWM circuit 202 provides PWM signals to drivers 204, 206, 208, and 210 (based at least in part on an input signal received through input terminal or pin IN), which actuate (ON) and de-actuate (OFF) transistor Q5 through Q8 of H-bridge 212 to drive load 216, while sensor 214 detects or senses the load current based at least in part on the control signals from drivers 208 and 210.

Figure 3A:
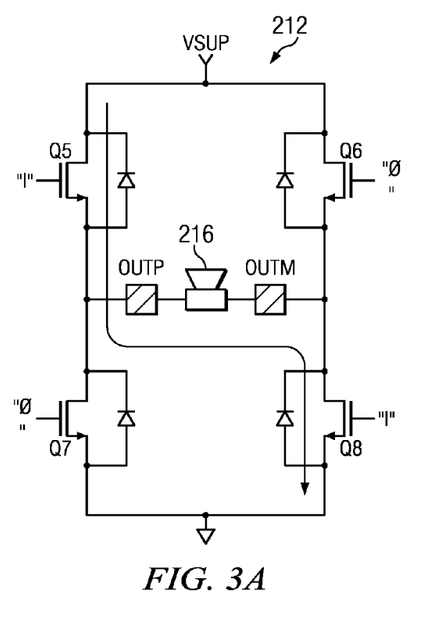
FIGS. 3A through 3C are circuit diagrams of operational modes of the H-bridge of FIG. 2.
Figure 3B:
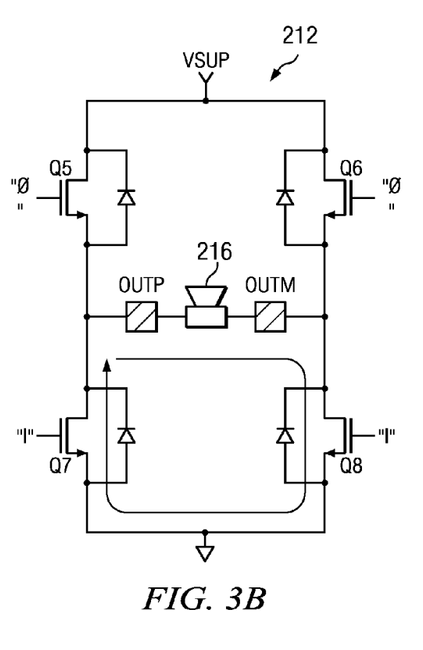
Figure 3C:
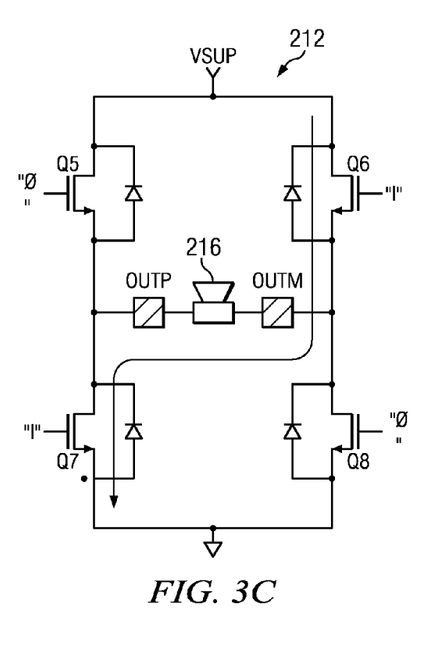

Typically, the class-D amplifier has three separate modes or states of operation as part of its modulation scheme, which can be seen in FIGS. 3A through 3C. In FIG. 3A, a "1" state is shown where transistors Q5 and Q8 are ON and transistors Q6 and Q7 are OFF, which enables current to flow from the supply VSUP to ground through the load 216 and transistors Q5 and Q8. In FIG. 3C, a "−1" state is shown where transistors Q6 and Q7 are ON and transistors Q5 and Q8 are OFF, which enables current to flow from the supply VSUP to ground through the load 216 and transistors Q6 and Q7. Finally, in FIG. 3B, a "0" state or low-side recycling mode is shown, where transistors Q7 and Q8 are ON and Q5 and Q6 are OFF. In this low-side recycling mode, load 216 (which is generally inductive) enables the output or load current to be recycled through transistors Q7 and Q8. Because speaker loads (for load 216) tend to be more inductive, capacitive, or a combination of both depending on frequency, the load current's phase is variable with respect to the load voltage, depending on the frequency. Thus, merely capturing the voltage across Q7 or Q8 while the load is driven to derive the load current is inadequate because the lag and/or lead generated by the inductance and capacitance in load 216 generates measurement errors.

This problem, however, is overcome with sensor 214. Sensor 214 takes advantage of the fact that at least one of transistors Q7 and Q8 is ON by measuring the current through transistors Q7 and Q8 when either or both are ON. Preferably, sensor 214 accomplishes this by sample, holding, and applying (or minoring) the drain-source (or collector-emitter in the case of bipolar transistors) voltages to a scaled transistor (which is typically N times smaller than transistor Q7 or Q8).

Figure 4:
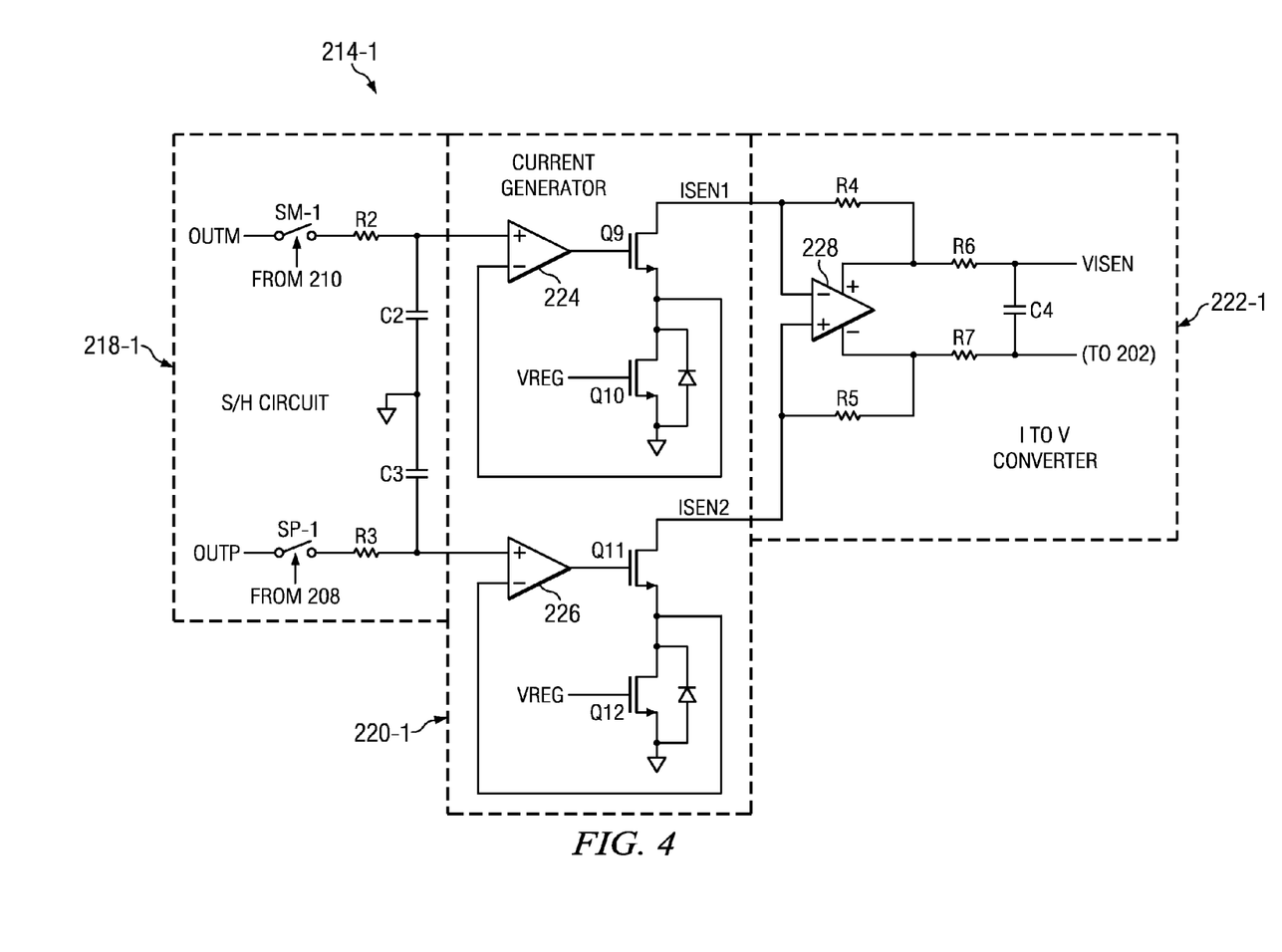
FIGS. 4 through 6 are a circuit diagram of examples of the sensor of FIG. 2.

Turning to FIG. 4, an example of sensor 214 of FIG. 2 (referred to here as 214-1) can be seen in greater detail. Sensor 214-1 generally comprises S/H circuit 218-1, current generator 220-1, and current-to-voltage (I-to-V) converter 222-1. In operation, when transistor Q7 or Q8 is ON, switches SP-1 or SM-1 is respectively closed so as to sample the voltages on output terminals or pins OUTP or OUTM onto capacitor C3 or C2 (respectively). Additionally, resistors R2 and R3 are generally used to filter the signals on output terminals OUTM and OUTP and to reduce the effect of charge injection on capacitors C2 and C3 (respectively) through switches SM-1 and SP-1 (respectively). These sampled voltages from capacitors C2 and C3 are then provided to the non-inverting terminals of amplifiers 224 and 226 (respectively). The amplifiers 224 and 226 in conjunction with their respective control transistors Q9 and Q11 (which are typically NMOS transistors) adjust the drain-source (or collector-emitter) voltage across (and current through) sense transistors Q10 and Q12 (which are typically NMOS transistors and which typically receive regulated voltage VREG at their gates; this voltage is the same voltage which is used to drive transistors Q7 and Q8). Generally, transistors Q10 and Q12 are the same type of transistors as transistors Q7 and Q8 (i.e., NMOS transistors), but are scaled so that the ratio of sizes is N to 1, with N being greater than or equal to 1. A reason for this is that the drain-source (or collector-emitter) voltage across transistors Q7 and Q8 is mirrored or replicated on transistors Q12 and Q10 (respectively), and, due to the large sizes of transistors Q7 and Q8, scaling transistors Q12 and Q10 reduce the magnitude of the sense currents ISEN2 and ISEN1 (respectively), which track the load current. The sense currents ISEN1 and ISEN2 from current generator 220-1 are then converted to a sense voltage VISEN by I-to-V converter 222-1 (which is generally comprised of a differential amplifier 228 and resistors R4 and R5). Also, included in the I-to-V converter 222-1 is a low pass filter (which is generally comprised of resistors R6 and R7 and capacitor C4).

To better understand the general operation of sensor 214-1 in conjunction with the class D amplifier shown in FIG. 2, one can assume for the purposes of illustration that load 216 is an inductive load, where the load current lags the output or load voltage. If the output voltage is being driven differentially positive (but approaching zero), transistors Q5 and Q8 are ON (as shown in FIG. 3A) initially, with H-bridge 212 entering the low-side recycling mode (as shown in FIG. 3B) thereafter. The inductor (as part of load 216) would inhibit a change in the load current during the low-side recycling mode, meaning that transistor Q8 would have a positive drain-source (or collector-emitter) voltage, while transistor Q7 would have a negative one. Thus, the sensed current would originate from transistor Q8. Thereafter, when the output voltage is driven differentially negative, transistors Q6 and Q7 are ON (as shown in FIG. 3C). However, the current is lagging the output voltage, and the current flows from GND through Q7 to terminal OUTP (through load 216) and to output terminal OUTM (through Q6) to supply VSUP. In this case, the drain-source voltage of transistor Q7 would be negative, resulting in there being no contribution to the sensed current during this state. However, during this phase, the sampled and held voltage on capacitor C2 (of FIG. 4) would provide the sense current with sufficient accuracy. During the subsequent low-side recycling mode, the sensed current contribution would come from transistors Q8 to allow for the sensing of a positive current from transistor Q8 instead of a negative current for the "−1" state (as shown in FIG. 3C). In fact, the sensed current is derived from whichever of transistors Q7 and Q8 is ON and has a positive VDS, which occurs for the largest portion of a PWM period.

Figure 5:
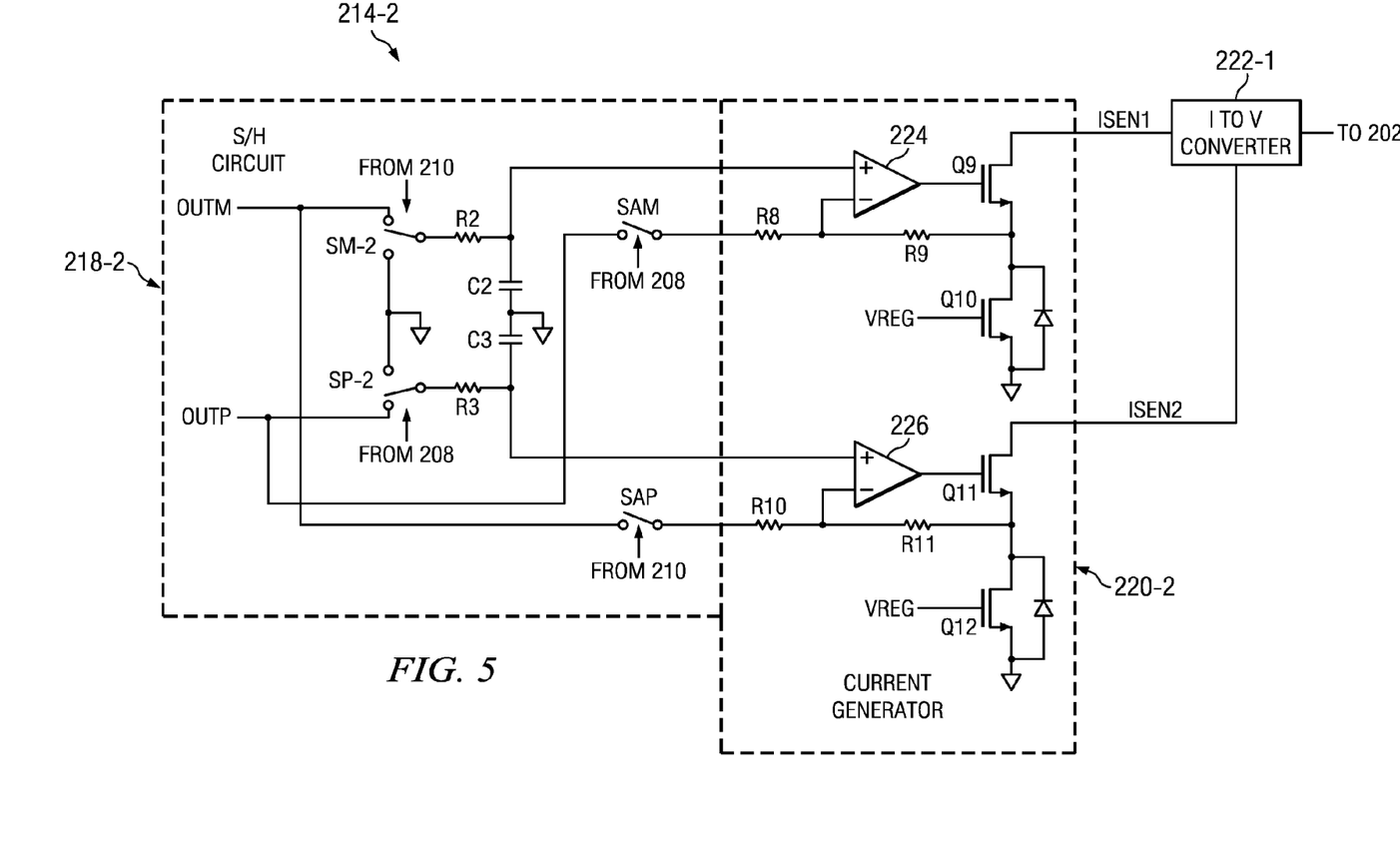

In FIG. 5, another example of the sensor 214 of FIG. 2 (referred to here as 214-2) can be seen in greater detail. Sensor 214-2 employs I-to-V converter 222-1 (similar to sensor 214-1), but the configuration S/H circuit 218-2 and current generator 220-2 differ from S/H circuit 218-1 and current generator 220-1. A reason for having this configuration is the detection of "zero currents" due to negative drain-source (or collector-emitter) voltages. During the low-side recycling mode, at least one of transistors Q7 and Q8 is ON, which should (ideally) be sufficient to allow for the drain-source (or collector-emitter) voltage measurement. However, when the load current and load voltage are output of phase, a negative drain-source (or collector-emitter) voltage may be present, which results in a "zero current" measurement. Under these circumstances and to combat this problem, sensor 214-2 applies both the drain-source (or collector-emitter) voltage, be it positive or negative, and its inverse to the sense transistor Q10 or Q12 to generally ensure that the drain-source (or collector-emitter) voltage, which is measured, is positive.

To enable this type of operation, switches SP-1 and SM-1 are replaced with switches SP-2 and SM-2, while voltage dividers (preferably resistors R8/R9 and R10/R11) and switches SAM and SAP are added. Switches SP-2 and SM-2 are double throw transistors that ground capacitors C2 and C3 when de-actuated or turned OFF and couple terminals OUTP and OUTM to capacitors C2 and C3 when actuated or turned ON. When driver 210 actuates or turns ON transistor Q8, switches SM-2 and SAP are turned ON. This enables the drain-source (or collector-emitter) voltage across transistor Q8 to be mirrored across transistor Q10 and the inverse of the drain-source (or collector-emitter) voltage across transistor Q8 (because the voltage is applied to the inverting terminal of amplifier 226) to be mirrored across transistor Q12. Similarly, switches SP-2 and SAM would be turned ON or actuated to make a similar measurement when transistor Q7 is ON or actuated. Thus, I-to-V converter 222-1 would be able to capture the magnitude and sign of the load current, regardless of whether a negative drain-source (or collector-emitter) voltage is present.

Figure 6:
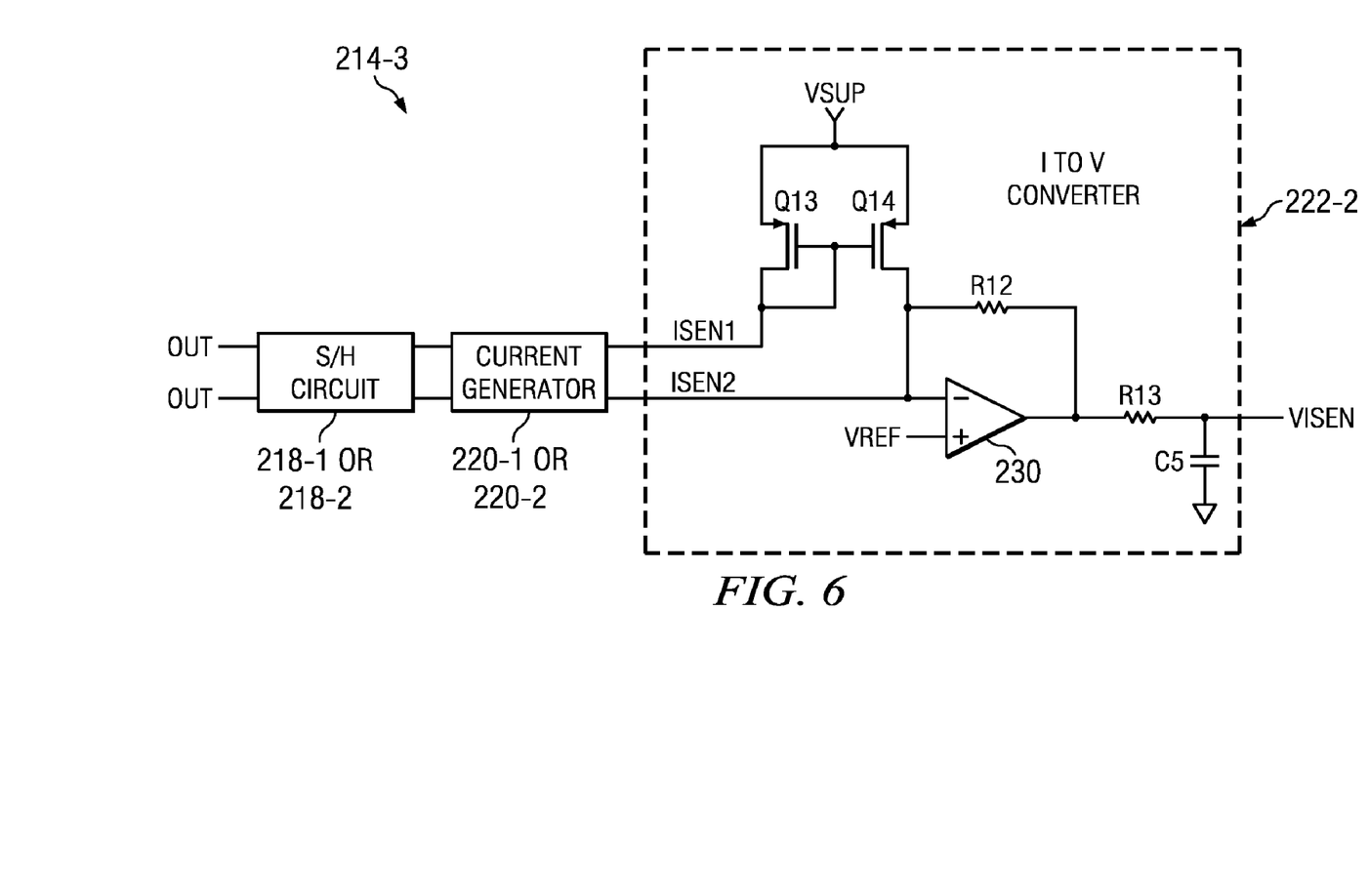

Turning now to FIG. 6, another example of the sensor 214 of FIG. 2 (referred to here as 214-3) can be seen in greater detail. Sensor 214-3 uses S/H circuit 218-1 or 218-2 and current generator 220-1 and 220-2, but, instead of using converter 222-1, sensor 214-3 uses I-to-V converter 222-2 to generate a single ended sense voltage VISEN output. To accomplish this, converter 222-2 uses a current minor (which is generally comprised of PMOS transistors Q13 and Q14) to mirror sense current ISEN1. The mirrored sense current ISEN1 is then combined with sense current ISEN2 at the inverting terminal of amplifier 230 (while a reference voltage VREF is applied to the non-inverting terminal of amplifier 230). The sense voltage VISEN is then generated (and filtered) by amplifier 230, resistors R12 and R13, and capacitor C5.

As a result of using the sensor 214, the performance of circuit 200 is improved over other conventional circuits. In particular, the sample-and-hold during periods where the load voltage and load current are out-of-phase helps improve the linearity performance. For example, Table 1 below shows the total harmonic distortion (THD) with and without the sample-and-hold for a 1 kHz sign wave input signal and an 8 kHz band of interest for calculating THD.

TABLE 1

| Phase shift | 0° | 15° | 30° | 45° | 60° | 75° | 90° |
|---|---|---|---|---|---|---|---|
| THD W/O S/H | −85.5 dB | −50 dB | −33 dB | −24.7 dB | −19.5 dB | −15.7 dB | −12 dB |
| THD W/S/H | −85.5 dB | −85.5 dB | −73 dB | −64.2 dB | −59.2 dB | −56.3 dB | −43.8 dB |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
  a class-D amplifier having a low-side recycling mode, a pair of low-side NMOS transistors, and a pair of output terminals;
  a sample-and-hold (S/H) circuit that is coupled to the pair of output terminals, wherein the S/H circuit samples a voltage on each of the pair of output terminals of the class-D amplifier when its associated low-side NMOS transistor is actuated;
  a current generator that is coupled to the S/H circuit, wherein the current generator uses the voltages on the pair of output terminals sampled by the S/H circuit to minor the drain-source voltages of the pair of low-side NMOS transistors on a pair of sense transistors, and wherein the drain-source voltages mirrored on the pair of sense transistors generates a pair of sense currents; and
  a current-to-voltage (I-to-V) converter that is coupled to the current generator so as to convert the sense currents to a sense voltage.

2. The apparatus of claim 1, wherein the S/H circuit further comprises:
  a pair of switches, wherein each switch is coupled to at least one of the pair of output terminals, and wherein each switch is associated with at least one of the pair of low-side NMOS transistors; and
  a pair of capacitors, wherein each capacitor is associated with at least one of the switches, and wherein each switch provides the voltage from its associated output terminal when its associated low-side NMOS transistor is actuated.

3. The apparatus of claim 2, wherein the ratio of sizes of each of the pair of sense transistors to its associated low-side NMOS transistor is 1:N, wherein N is greater than or equal to 1.

4. An apparatus comprising:
   an H-bridge having a first input terminal, a second input terminal, a first output terminal, and a second output terminal;
   a first driver that is coupled to provide a first control signal to the first terminal of the H-bridge;
   a second driver that is coupled to provide a second control signal to the second terminal of the H-bridge;
   an S/H circuit that is coupled to the first driver, second driver, the first output terminal of the H-bridge, and the second output terminal of the H-bridge, wherein the S/H circuit samples a first output voltage from the first output terminal of the H-bridge based at least in part on the state of the first control signal, and wherein the S/H circuit samples a second voltage from the second output terminal of the H-bridge based at least in part on the state of the second control signal;
   a current generator including:
      a first amplifier having a first input terminal, a second terminal, and an output terminal, wherein the first input terminal of the first amplifier is coupled to the S/H circuit;
      a second amplifier having a first input terminal, a second terminal, and an output terminal, wherein the first input terminal of the second amplifier is coupled to the S/H circuit;
      a first transistor having a first passive electrode, a second passive electrode, and a control electrode, wherein the control electrode of the first transistor is coupled to the output terminal of the first amplifier;
      a second transistor having a first passive electrode, a second passive electrode, and a control electrode, wherein first passive electrode of the second transistor is coupled to the second passive electrode of the first transistor;
      a third transistor having a first passive electrode, a second passive electrode, and a control electrode, wherein the control electrode of the third transistor is coupled to the output terminal of the second amplifier; and
      a fourth transistor having a first passive electrode, a second passive electrode, and a control electrode, wherein first passive electrode of the fourth transistor is coupled to the second passive electrode of the third transistor; and
   an I-to-V converter that is coupled to the first passive electrodes of the first and third transistors.

5. The apparatus of claim 4, wherein the H-bridge further comprises:
   a first low-side transistor having a first passive electrode, a second passive electrode, and a control electrode, wherein the first passive electrode of the first low-side transistor is coupled to the first output terminal of the H-bridge, and wherein the control electrode of the first low-side transistor is coupled to the first driver; and
   a second low-side transistor having a first passive electrode, a second passive electrode, and a control electrode, wherein the first passive electrode of the second low-side transistor is coupled to the second output terminal of the H-bridge, and wherein the control electrode of the second low-side transistor is coupled to the second driver.

6. The apparatus of claim 5, wherein ratio of the sizes the second transistor to the first low-side transistor and the fourth transistor to the second low-side transistor is 1:N, wherein N is greater than or equal to 1.

7. The apparatus of claim 6, wherein the S/H circuit further comprises:
   a first switch that is coupled to the first output terminal of the H-bridge, wherein the first switch is controlled by the first control signal;
   a second switch that is coupled to the second output terminal of the H-bridge, wherein the second switch is controlled by the second control signal;
   a first resistor that is coupled to the first switch;
   a second resistor that is coupled to the second switch;
   a first capacitor that is coupled to the first resistor; and
   a second capacitor that is coupled to the second resistor.

8. The apparatus of claim 7, wherein the first and second switch are each double-throw switches that are each coupled to ground, and wherein the current generator further comprises:
   a third switch that is coupled to the first output terminal of the H-bridge and that is controlled by the second control signal;
   a first set of resistors coupled in series with one another between the third switch and the second passive electrode of the first transistor, wherein the second input terminal of the first amplifier is coupled to a node between at least two resistors from the first set;
   a fourth switch that is coupled to the second output terminal of the H-bridge and that is controlled by the first control signal; and
   a second set of resistors coupled in series with one another between the fourth switch and the second passive electrode of the third transistor, wherein the second input terminal of the second amplifier is coupled to a node between at least two resistors from the second set.

9. The apparatus of claim 6, wherein the I-to-V converter further comprises a differential amplifier that outputs a differential sense voltage.

10. The apparatus of claim 6, wherein the I-to-V converter further comprises:
    a current mirror that is coupled to the first passive electrode of the first transistor; and
    a third amplifier having an input terminal that is coupled to the current mirror and the first passive electrode of the third transistor.

11. An apparatus comprising:
    a class-D amplifier having:
       a negative output terminal;
       a positive output terminal;
       a first NMOS transistor that is coupled to the negative output terminal at its drain and that is controlled by a first control signal;
       a second NMOS transistor that is coupled to the positive output terminal at its drain and that is controlled by a second control signal;
    an S/H circuit that is coupled to the negative output terminal and the positive output terminal, wherein the S/H circuit samples the voltage on the negative output terminal when the first NMOS transistor is actuated, and wherein the S/H circuit samples the voltage on the positive output terminal when the second NMOS transistor is actuated;
    a current generator having:

a first amplifier having a first input terminal, a second terminal, and an output terminal, wherein the first input terminal of the first amplifier is coupled to the S/H circuit;

a second amplifier having a first input terminal, a second terminal, and an output terminal, wherein the first input terminal of the second amplifier is coupled to the S/H circuit;

a third NMOS transistor that is coupled to the output terminal of the first amplifier at its gate;

a fourth NMOS transistor that is coupled to the source of the third NMOS at its drain;

a fifth NMOS transistor that is coupled to the output terminal of the second amplifier at its gate;

a sixth NMOS transistor that is coupled to the source of the fifth NMOS at its drain; and an I-to-V converter that is coupled to the drains of the third and fifth NMOS transistors.

12. The apparatus of claim 11, wherein ratio of the sizes the fourth NMOS transistor to the first NMOS transistor and the sixth NMOS transistor to the second NMOS transistor is 1:N, wherein N is greater than or equal to 1.

13. The apparatus of claim 12, wherein the S/H circuit further comprises:

a first switch that is coupled to the negative output terminal, wherein the first switch is controlled by the first control signal;

a second switch that is coupled to the positive output terminal, wherein the second switch is controlled by the second control signal;

a first resistor that is coupled to the first switch;

a second resistor that is coupled to the second switch;

a first capacitor that is coupled to the first resistor; and a second capacitor that is coupled to the second resistor.

14. The apparatus of claim 13, wherein the first and second switch are each double-throw switches that are each coupled to ground, and wherein the current generator further comprises:

a third switch that is coupled to the negative output terminal and that is controlled by the second control signal;

a first set of resistors coupled in series with one another between the third switch and the second passive electrode of the third transistor, wherein the second input terminal of the first amplifier is coupled to a node between at least two resistors from the first set;

a fourth switch that is coupled to the positive output terminal and that is controlled by the first control signal; and a second set of resistors coupled in series with one another between the fourth switch and the second passive electrode of the fifth transistor, wherein the second input terminal of the second amplifier is coupled to a node between at least two resistors from the second set.

15. The apparatus of claim 12, wherein the I-to-V converter further comprises a differential amplifier that outputs a differential sense voltage.

16. The apparatus of claim 12, wherein the I-to-V converter further comprises:

a current mirror that is coupled to the first passive electrode of the third transistor; and a third amplifier having an input terminal that is coupled to the current mirror and the first passive electrode of the fifth transistor.

17. A method comprising:

actuating at least one of a first and a second low-side NMOS transistors within a class-D amplifier;

sampling voltages on each of positive and negative output terminals of the class-D amplifier when its associated low-side NMOS transistors is actuated;

generating first and second sense currents from the first and second low-side NMOS transistors of the class-D amplifier, respectively; and converting the first and second sense currents into a sense voltage.

18. The method of claim 17, wherein the step of generating the first and second sense currents further comprises mirroring the drain-source voltages of the first and second low-side NMOS transistor on first and second sense NMOS transistors, respectively.

19. The method of claim 18, wherein the ratio of the first sense current to a first current through the first NMOS transistor is 1:N, wherein N is greater than or equal to 1.

20. The method of claim 19, wherein the ratio of the second sense current to a second current through the second NMOS transistor is 1:N, wherein N is greater than or equal to 1.

* * * * *